United States Patent
Chen et al.

[11] Patent Number: 5,960,279
[45] Date of Patent: Sep. 28, 1999

[54] METHOD OF FABRICATING A CAPACITOR ON A RUGGED STACKED OXIDE LAYER

[75] Inventors: Kuang-Chao Chen; Tuby Tu, both of Hsin-Chu, Taiwan

[73] Assignee: Mosel Vitellic Incorporated, Hsin-Chu, Taiwan

[21] Appl. No.: 08/697,622

[22] Filed: Aug. 27, 1996

[51] Int. Cl.⁶ .............................................. H01L 21/8242
[52] U.S. Cl. ........................................ 438/253; 438/396
[58] Field of Search .................................. 438/238, 239, 438/253–256, 381, 396–399

[56] References Cited

U.S. PATENT DOCUMENTS

| 5,338,700 | 8/1994 | Dennison et al. | 438/255 |
| 5,639,689 | 6/1997 | Woo | 438/398 |
| 5,723,379 | 3/1998 | Watanabe et al. | 438/398 |

*Primary Examiner*—Joni Chang
*Attorney, Agent, or Firm*—Chi Ping Chang

[57] ABSTRACT

The present invention relates to a stacked memory capacitor of a DRAM cell, particularly, relates to a DRAM cell having a memory capacitor whose storage electrode possesses a remarkably increase area without increasing its occupation area and the complexity of fabrication thereof. By disposing the storage electrode of the memory capacitor on a rugged stacked oxide layer, the area of the storage electrode is remarkably enlarged since the growing of the storage electrode made of a doped polysilicon layer is followed along the topography of the rugged stacked oxide layer, thereby, resulting in a rugged surface thereof. The entire rugged surface of the storage electrode is covered with a dielectric layer to form a plate electrode made of a doped polysilicon layer. The memory capacitor provided by the invention achieves a higher capacitance while maintaining the same occupation area and packing density as that of the conventional arts.

7 Claims, 4 Drawing Sheets

METHOD OF FABRICATING A CAPACITOR ON A RUGGED STACKED OXIDE LAYER

DESCRIPTION OF THE PRIOR ART

Many significant progresses have recently been made in development of semiconductor memory devices. Especially, various attempts have been made to provide a high integration density for a dynamic random access memory (to be referred to as a DRAM hereafter) without decreasing storage characteristics thereof. Referring to FIG. 1, each DRAM cell comprises a single field effect transistor T and a single capacitor C. The field effect transistor T has a first conduction terminal connected to a storage electrode of the capacitor C and a second conduction terminal connected to a bit line BL. In addition, the field effect transistor T has a gate electrode connected to a word line WL. The capacitor C has an additional electrode connected to ground. Many DRAM cells are arranged in a matrix form to store large quantity information. At the time of data writing, since a predetermined potential is applied to the word line WL so that the field effect transistor T is rendered conductive, a charge from the bit line BL is stored in the capacitor C.

On the other hand, at the time of reading data, since a predetermined potential is applied to the word line WL so that the field effect transistor T is rendered conductive, the charge stored in the capacitor is extracted through the bit line BL. Accordingly, information "0" and "1" is represented by an electric charge and no charge (or alternatively, no charge and an electric charge) on the storage electrode of the memory capacitors. During the reading cycle, the capacitor C also shares charges with the bit line BL capacitance. The ratio of the two capacitances has to be high enough to ensure that resulting voltage can be detected by a sense amplifier. Hence, it is expected that the capacitance of the capacitor should be raised as much as possible to improve a signal to noise (S/N) ratio of the DRAM cell while maintaining the same occupation area and the complexity of fabrication as that of the conventional arts.

Mostly, the capacitor of a DRAM cell comprises a storage electrode of a polysilicon layer, a plate electrode of a polysilicon layer, and a dielectric film of a stacked ONO (Oxide-Nitride-Oxide) layer. Although some studies have shown that thinning the dielectric film can increase the capacitance of a capacitor, a thinner dielectric film is generally less reliable as the number of defects such as pinholes may increase. In addition, the electric field strength applied to the dielectric film will increase to cause a dielectric breakdown. Therefore, the dielectric film is limited by its thickness. Another method to provide a higher capacitance is to enlarge an area of the storage electrode. However, if the area of a memory capacitor is enlarged, the occupation area of the memory cell will increase concurrently, resulting in a big obstacle in implementation of a highly integrated device with a large memory capacity.

Technologies for increasing a capacitance of a memory capacitor irrespective of a decrease in an occupation area thereof have been proposed in order to solve the problems described above. For example, the article entitled "NOVEL HIGH DENSITY, STACKED CAPACITOR MOSRAM" by M. Koyanagi et al. and published in the Proceedings of the International Electron Devices Meeting, 1978, pp. 348–351 discloses a structure wherein a storage capacitor includes two polysilicon layers as shown in FIG. 2. Referring to the FIG. 2, a storage electrode 7 made of a first doped polysilicon layer connected to one of source and drain regions of the field effect transistor, a plate electrode 9 made of a second doped polysilicon layer opposite to the storage electrode and a dielectric film of of ONO (Oxide-Nitride-Oxide) therebetween constitute a memory capacitor. The amount of charges stored in this memory capacitor is determined by the area of the storage electrode 7 and the plate electrode 9 as well as the way they are stacked on the field effect transistor. Therefore, the capacitance and the charge can be enhanced to some extents. Recently, a method of forming a rugged polysilicon layer had been proposed to enlarge an area of the the storage electrode, in which a layer of amorphous silicon is is deposited and then annealed at a higher temperature in a $N_2$ ambient to crystalize a surface of the amorphous silicon to a rugged surface with grain shapes However, the two conventional structures described above cannot have a sufficient capacitance when a DRAM cell area is further reduced to obtain a higher packing density. Hence, a need exists to provide a memory capacitor of a a DRAM cell having a higher capacitance while maintaining the same occupation area of a memory capacitor as disclosed by the conventional art.

SUMMARY OF INVENTION

Therefore, an object of the invention is to provide a method of making a DRAM cell which will remarkably increase the capacitance of a memory capacitor without increasing its occupation area as compared to that of the conventional art.

Another object of the invention is to provide a higher integration density by having a higher capacitance of a memory capacitor while occupying a smaller area than that disclosed by the conventional arts.

A method of forming a stacked capacitor, according to the invention, comprises the following steps:

a) forming a field effect transistor and an isolation region of a field oxide in a surface of a silicon substrate, in which the field effect transistor further comprises a gate electrode (i.e. word line), source/drain regions, and a gate insulating film interposed therebetween;

b) depositing a PSG layer and then a rugged stacked oxide layer, composed of a lower layer of PE TEOS and an upper layer of $O_3$/TE OS;

c) forming a storage electrode contact hole by etching the rugged stacked oxide layer and the PSG layer;

d) performing a step of annealing and then depositing a polysilicon layer;

f) forming a dielectric film on the polysilicon layer and then patterned to form a storage electrode which is connected to one of the source and drain regions of the field effect transistor;

e) forming a plate electrode by depositing a polysilicon layer and then patterned;

f) depositing an insulating layer and then patterned to form a bit line contact hole;

g) forming a bit line which is connected to one of the source and drain regions of the field effect transistor by depositing a a polysilicon layer and then patterned.

BRIEF DESCRIPTION OF THE DRAWINGS

The invention itself, however, as well as other features and advantages thereof, will be best understood by reference to the detailed description which follows, read in conjunction with the accompanying drawings, wherein.

DESCRIPTION OF THE PREFERRED EMBODIMENT

The motion of the present invention is excited by the following experiment which comprises deposition of an oxide layer by a plasma-enhanced chemical vapor deposition (PECVD) method and then a deposition of an oxide layer by a method of $O_3$/TEOS in which an $O_3$ gas is introduced to a vapor of a tetraethoxytesilica (abbreviated TEOS) solution and thus a product of silicon dioxide can be obtained after chemical reactions. In this specification, the term of "$O_3$/TEOS" or "TEOS" is referred to as a final product of an oxide layers rather than a method of forming the final product. As a result, a surface of the $O_3$/TEOS is constituted by many island structures which can be proved by a scaning electron microscopic (SEM) photography later. This result suggests that deposition of a polysilicon layer on the surface of the $O_3$/TEOS will increase the area of the storage electrode since the growing of the polysilicon layer is followed along the topography of the $O_3$/TEOS. It should be noted that the PE TEOS is laid underneath the $O_3$/TEOS so that the formation of a rugged surface of the $O_3$/TEOS only occurs when the $O_3$/TEOS has a base layer of the PE TEOS and these two oxide layers constitute the so called "rugged stacked oxide layer" in this specification.

Figure 1:
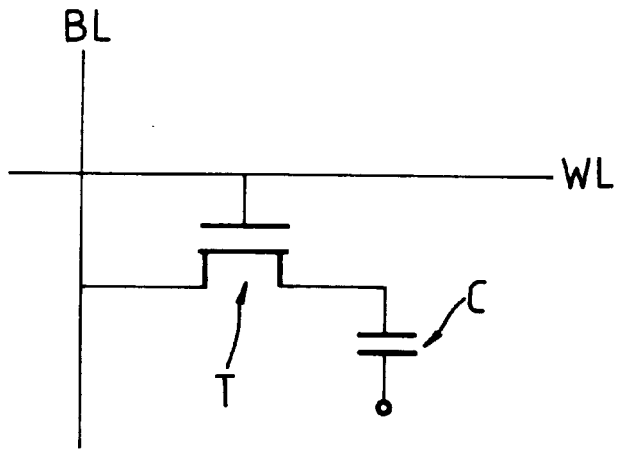
FIG. 1 is a circuit diagram of a DRAM cell.
Figure 2:
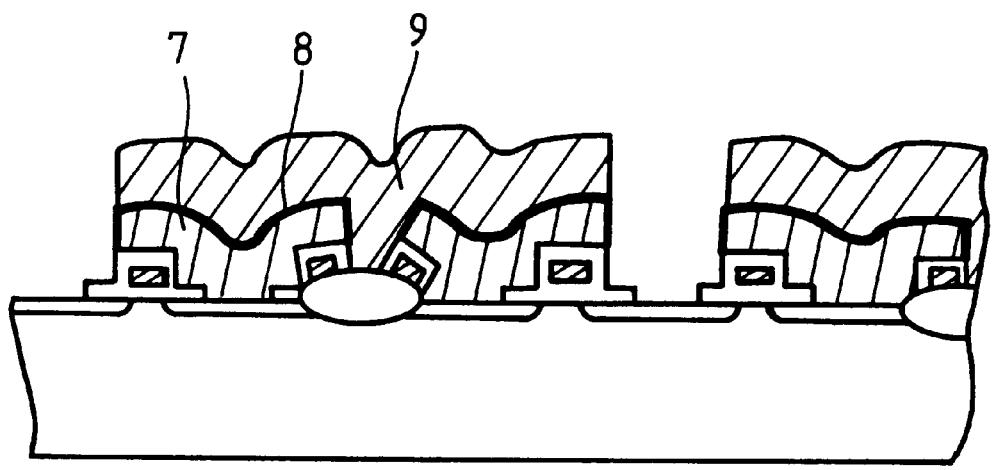
FIG. 2 is a cross-sectional view of a conventional stacked memory capacitor.
Figure 3:
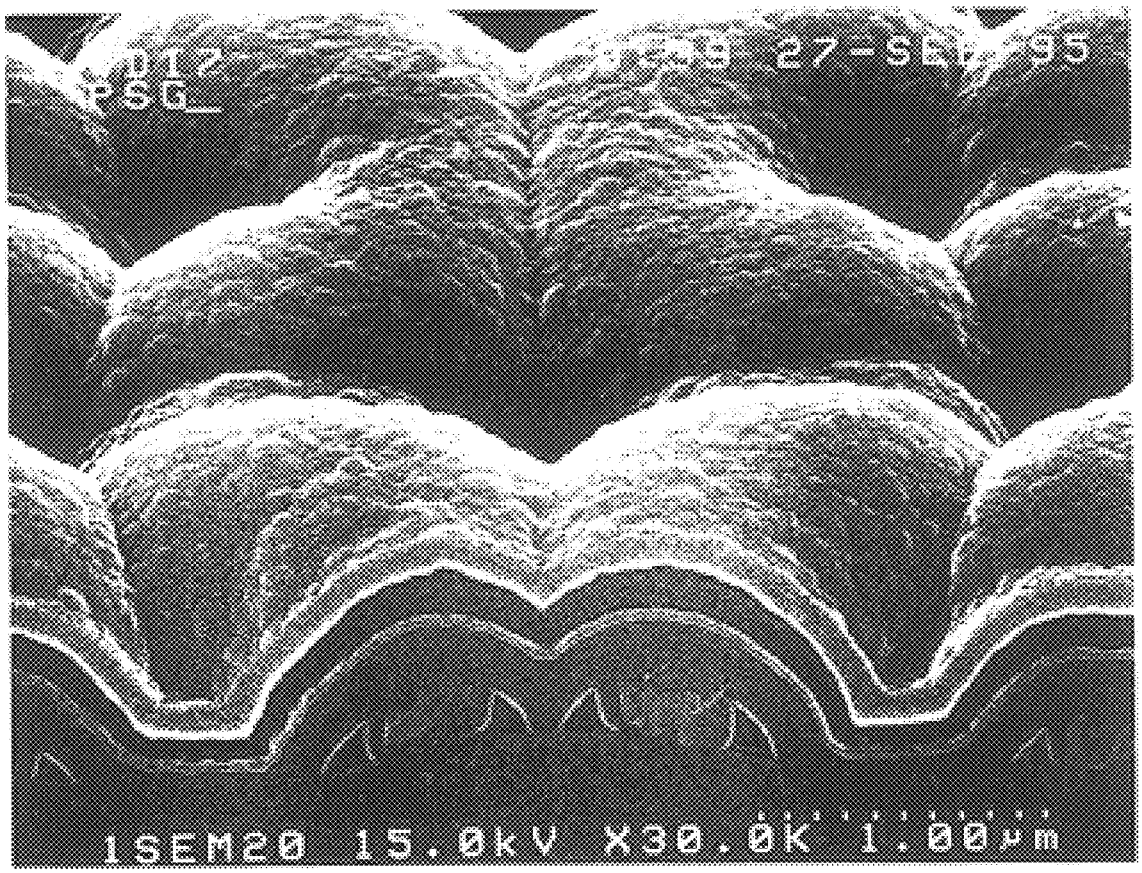
FIG. 3 is a SEM picture of a conventional oxide layer and a polysilicon layer thereon.
Figure 4:
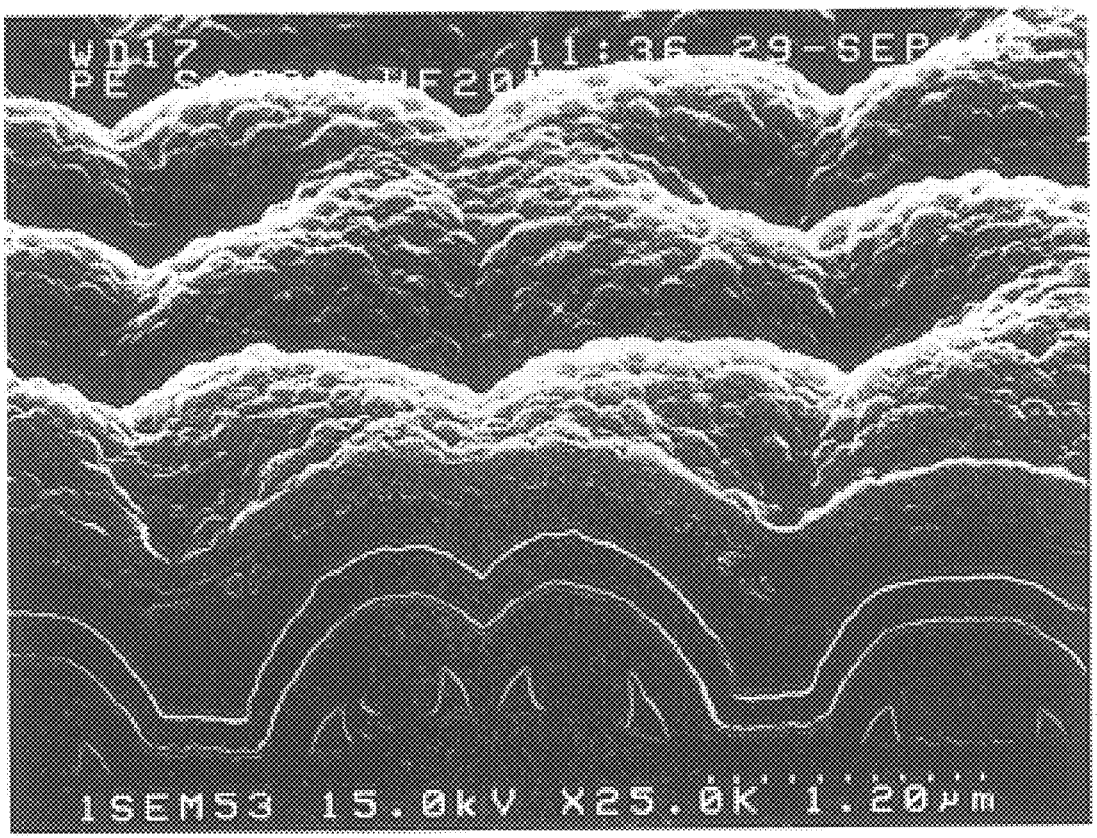
FIG. 4 is a SEM picture of a rugged stacked oxide layer and a polysilicon layer thereon, according to the present invention.

In order to verify the above inference, a SEM photograph of a stacked structure of the rugged stacked oxide layer and the polysilicon layer thereon according to the present invention was shown in FIG. 4 in which the surface of the polysilicon layer, (i.e. positioned in the top layer of FIG. 4) is much more corrugated than that of a conventional stacked structure of an oxide layer and a polysilicon layer thereon as shown in FIG. 3 (it is noted that these two photographies have the same magnification). Additionally, the same result can be found in an interface between the polysilicon layer and the $O_3$/TEOS, which further enlarges the area of the storage electrode by removing the rugged stacked oxide layers and thus making a bottom surface of the storage electrode exposed.

The rugged stacked oxide layer can be also formed by the following methods, which comprise:

1. a process of depositing the $O_3$/TEOS on a thermal oxide layer;
2. a process of depositing the $O_3$/TEOS on a layer of PSG formed by a TEOS method;
3. a process of depositing the $O_3$/TEOS on a nitride layer formed by LPCVD or the PECVD methods. Meanwhile, the best growing conditions of the rugged stacked oxide layer comprise a a growing temperature of 300–500° C., a pressure of 200–760 Torr, and a flowing rate of $O_3$ to TEOS in a ratio larger than 8. For the purpose of forming a rough surface, the best growing conditions involving a PSG layer formed by a TEOS method comprise a growing temperature of 340–440° C., a pressure of 3–16 Torr, and a power of of 300–900 watts.

THE FIRST PREFERRED EMBODIMENT

A field effect transistor comprising a source/drain region 6 formed in a surface of a silicon substrate 1, a gate insulating film thereon, and a gate (that is the word line) 5 laid over the gate insulating film is performed. Meanwhile, a region of a field oxide 2 adjacent to a memory capacitor is used to ensure the DRAM cell having a good isolation between the adjacent memory capacitors and to ensure the cell information will not be inverted, as well as is formed by so called "LOCOS" (i.e., which is a method of a selective thermal oxidation of a silicon surface). Over the region of field oxide 2, another wordline is laid. It should be noted that the field effect transistor according to the present invention can be either a NMOS or a PMOS since these two devices can be both adopted in a stacked memory capacitor.

Figure 5:
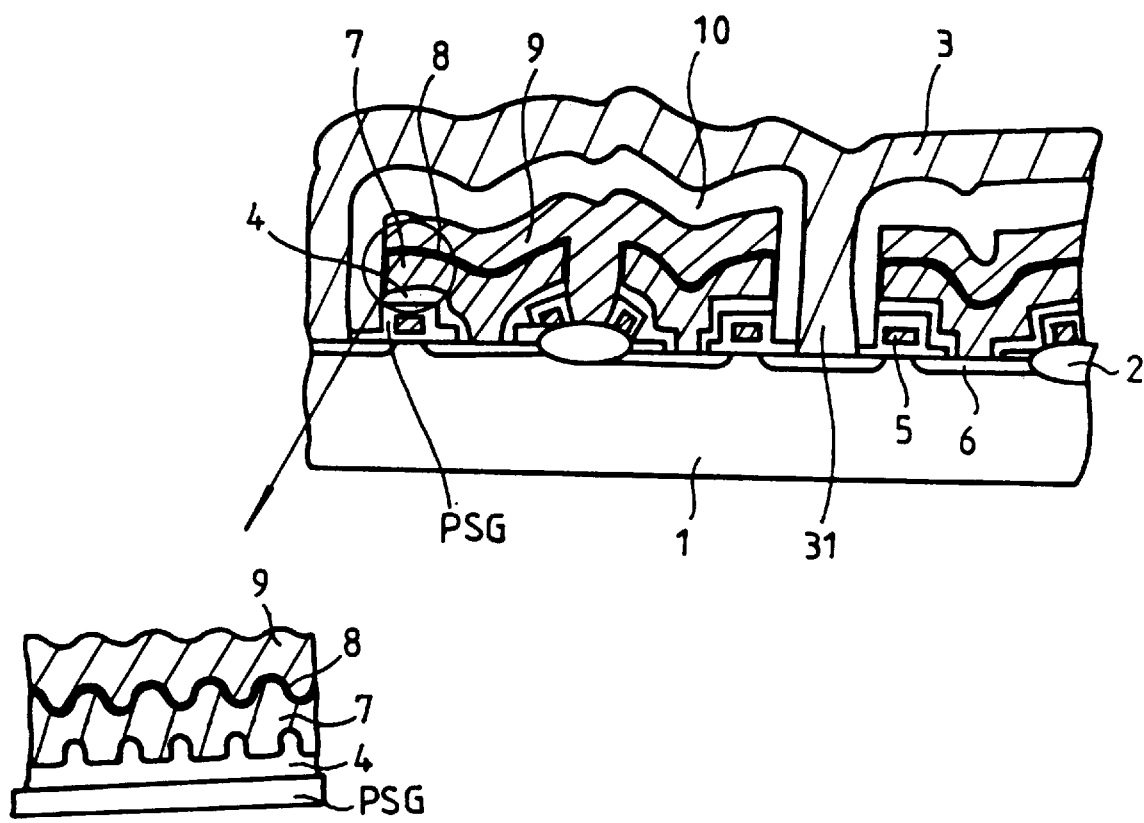
FIG. 5 is a cross-sectional view of a DRAM cell according to the invention.

Referring to FIG. 5, an insulating layer such as phosphosilicate glass (PSG) is deposited over the entire surface of silicon substrate 1 by a Chemical Vapor Deposition (CVD) method and followed by a deposition of a rugged stacked oxide layer, composed of a lower layer of the PE TEOS and an upper layer of the $O_3$/TEOS (not shown in the figure). Subsequently, a series of storage electrode contact holes are formed by etching the rugged stacked oxide layer 4 and the PSG layer using a patterned photoresist as a mask. Next, a polysilicon layer, used as a storage electrode, is deposited over the entire surface of silicon substrate 1. There after, an entire wafer is subjected to a thermal oxidation, or a deposition of an ONO to form a dielectric film 8 of the memory capacitor as shown in FIG. 3. Meanwhile, a step of annealing is necessary to densify the rugged stacked oxide layer prior to the step of depositing the polysilicon layer; otherwise the rugged stacked oxide layer would be damaged by a HF etchant, which is a necessary process preceded by the step of polysilicon deposition to ensure cleanliness of the wafer. Then, a storage electrode 7, connected to one of the source and drain regions of the field effect transistor, is formed by etching the polysilicon layer and the dielectric film using a patterned photoresist as a masks. Next, a plate electrodes 9 are formed by a deposition of a polysilicon layer and then an etching process using a patterned photoresist as a mask. An insulating layer 10 such as an oxide is then deposited to provide an isolation of the plate electrodes. A bit line contact hole 31 is formed by etching the insulating layer 10 and the PSG layer using a patterned photoresist as a mask. Then a patterned bit line 3, connected to one of the source and drain regions of the field effect transistor, is formed after depositing a polysilicon layer and then patterned using a patterned photoresist as a mask to complete the construction of the DRAM cell as shown in FIG. 5.

As a result, several features that the conventional art can not achieve are accomplished by the present invention as concluded as following:

1) since the storage electrode 7 formed on the rugged stacked oxide layer 4 has the corrugated surface, as is evident from the left magnified figure of FIG. 3, the area of the storage electrode can be enlarged and the capacitance of the memory capacitor is increased thereby;

2) the holding characteristic of the memory capacitor provided by the present invention is more reliable than that provided by the conventional art as the electric capacity of the former is increased;

3) Compared to the conventional art, the invention provides a memory capacitor having a higher capacitance while maintaining the same occupation area as that of a conventional memory capacitor to provide a higher integration density; and 4) compared to the conventional art, the memory capacitor of the present invention does not achieve at the expense of increased complexity of fabrication, thus the processes of the present invention can be easily adapted to the mass production, Although the preferred embodiments of the invention have been disclosed for illustrative purposes, those skilled in the art will appreciate that various modifications, additions and substitutions are possible, without departing from the scope and spirit of the invention, as disclosed in the accompanying claims

What is claimed is:

1. A method of fabricating a stacked memory capacitor of a DRAM cell comprising the steps of:

a) forming a field effect transistor and an isolation region of a field oxide in a surface of a silicon substrate, wherein the field effect transistor further comprises a gate electrode (i.e. a word line), source/drain regions, and a gate insulating film interposed therebetween;

b) depositing a PSG layer and then a rugged stacked oxide layer composed of a lower layer of a PE TEOS and an upper layer of an $O_3$/TEOS;

c) forming a storage electrode contact hole by etching the rugged stacked oxide layer and the PSG layer;

d) performing a step of annealing and then depositing a polysilicon layer;

f) forming a dielectric layer on the polysilicon layer and then patterned to form a storage electrode which is connected to one of the source and drain regions of the field effect transistor;

e) forming a plate electrode by depositing a polysilicon layer and then patterned;

f) depositing an insulating layer and then patterned to form a bit line contact hole; and g) forming a bit line connecting to one of the source and drain regions of the field effect transistor by depositing a polysilicon layer and then patterned.

2. A method of fabricating a stacked memory capacitor of a DRAM cell according to claim 1 wherein said insulating layer is an oxide.

3. A method of fabricating a stacked memory capacitor of a DRAM cell according to claim 1 wherein said rugged stacked oxide layer comprises a lower thermal oxide layer and an upper layer of an $O_3$/TEOS.

4. A method of fabricating a stacked memory capacitor of a DRAM cell according to claim 1 wherein said rugged stacked oxide layer comprises a lower layer of a PSG formed by a TEOS method and an upper layer of an $O_3$/TEOS.

5. A method of fabricating a stacked memory capacitor of a DRAM cell according to claim 1 wherein said rugged stacked oxide layer comprises a lower layer of a nitride formed by a LPCVD or PECVD methods and an upper layer of an $O_3$/TEOS.

6. A method of fabricating a stacked memory capacitor of a DRAM cell according to claim 1 wherein said dielectric film is an ONO (Oxide-Nitride-Oxide) formed by a CVD method.

7. A method of fabricating a stacked memory capacitor of a DRAM cell according to claim 1 wherein said dielectric film is formed by a thermal oxidation of a doped polysilicon layer.

* * * * *